United States Patent
Manda

(10) Patent No.: US 8,878,263 B2
(45) Date of Patent: Nov. 4, 2014

(54) SEMICONDUCTOR DEVICE, METHOD FOR MANUFACTURING SAME, AND SOLID-STATE IMAGE SENSING DEVICE

(75) Inventor: Shuji Manda, Kumamoto (JP)

(73) Assignee: Sony Corporation (JP)

( * ) Notice: Subject to any disclaimer, the term of this patent is extended or adjusted under 35 U.S.C. 154(b) by 390 days.

(21) Appl. No.: 12/784,639

(22) Filed: May 21, 2010

(65) Prior Publication Data

US 2010/0314672 A1 Dec. 16, 2010

(30) Foreign Application Priority Data

Jun. 11, 2009 (JP) ................. 2009-140530

(51) Int. Cl.
| | | |
|---|---|---|
| *H01L 31/0224* | (2006.01) | |
| *H01L 27/146* | (2006.01) | |
| *H01L 29/10* | (2006.01) | |
| *H01L 29/423* | (2006.01) | |
| *H01L 29/66* | (2006.01) | |
| *H01L 29/78* | (2006.01) | |

(52) U.S. Cl.
CPC .... *H01L 27/14609* (2013.01); *H01L 27/14645* (2013.01); *H01L 27/14689* (2013.01); *H01L 29/1095* (2013.01); *H01L 29/4236* (2013.01); *H01L 29/4238* (2013.01); *H01L 29/66734* (2013.01); *H01L 29/7813* (2013.01)
USPC .............. 257/292; 257/E27; 257/133; 257/91; 257/90; 438/60

(58) Field of Classification Search
USPC ................ 438/57–60; 257/290–293, 257/E27.133–E27.134
See application file for complete search history.

(56) References Cited

U.S. PATENT DOCUMENTS

| | | | | |
|---|---|---|---|---|
| 5,733,810 | A  * | 3/1998 | Baba et al. ............. | 438/268 |
| 6,232,626 | B1 * | 5/2001 | Rhodes .................. | 257/292 |
| 6,707,075 | B1 * | 3/2004 | Rogers et al. ........... | 257/117 |
| 7,659,564 | B2 * | 2/2010 | Adkisson et al. ........ | 257/293 |
| 2005/0093038 | A1 * | 5/2005 | Rhodes ................... | 257/292 |
| 2006/0068544 | A1 * | 3/2006 | Furuhata et al. ......... | 438/253 |
| 2007/0102740 | A1 * | 5/2007 | Ellis-Monaghan et al. .. | 257/292 |
| 2007/0131987 | A1 * | 6/2007 | Kim ....................... | 257/290 |
| 2008/0012069 | A1 * | 1/2008 | Mizokuchi .............. | 257/330 |
| 2008/0029796 | A1 * | 2/2008 | Mori et al. .............. | 257/292 |
| 2008/0083940 | A1 * | 4/2008 | Ezaki et al. ............. | 257/292 |
| 2010/0148230 | A1 * | 6/2010 | Stevens et al. .......... | 257/290 |
| 2010/0176441 | A1 * | 7/2010 | Hirota .................... | 257/324 |

FOREIGN PATENT DOCUMENTS

| | | | |
|---|---|---|---|
| JP | 2005-223084 | | 8/2005 |
| KR | 2006038241 A | * | 5/2006 |

* cited by examiner

*Primary Examiner* — Matthew W Such
*Assistant Examiner* — Ali Naraghi
(74) *Attorney, Agent, or Firm* — Sheridan Ross P.C.

(57) ABSTRACT

Disclosed herein is a semiconductor device including: a semiconductor substrate; a gate insulating film formed on surfaces of the semiconductor substrate including an internal surface of a hole formed in the semiconductor substrate and formed by radical oxidation or plasma oxidation; and a gate electrode formed as buried in the hole. The gate insulating film and the gate electrode form a vertical MOS.

13 Claims, 5 Drawing Sheets

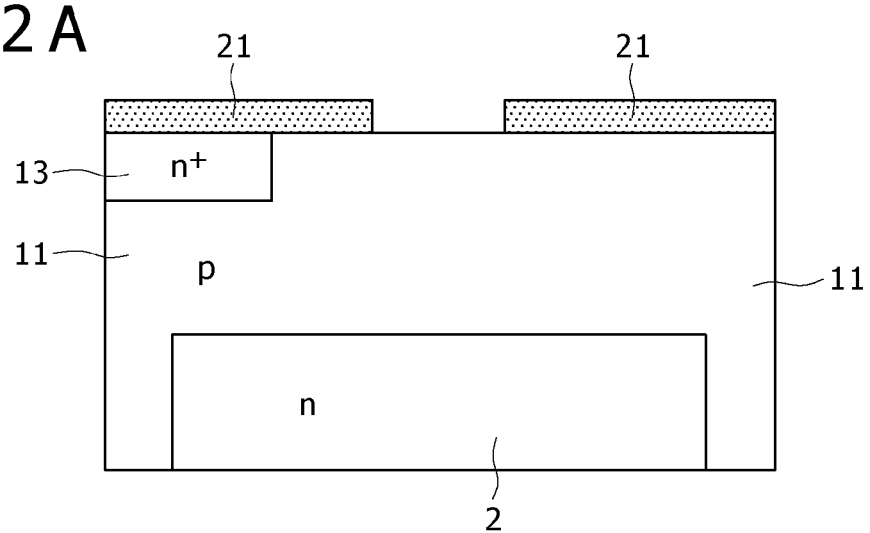
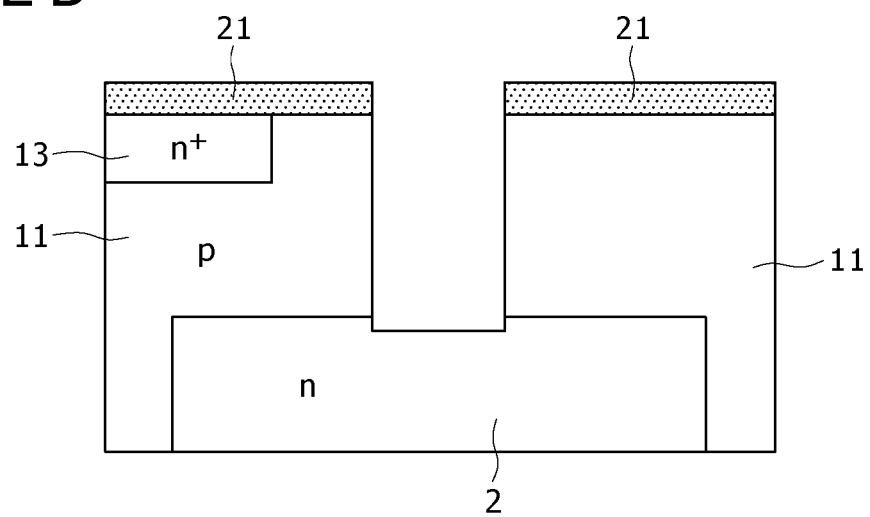
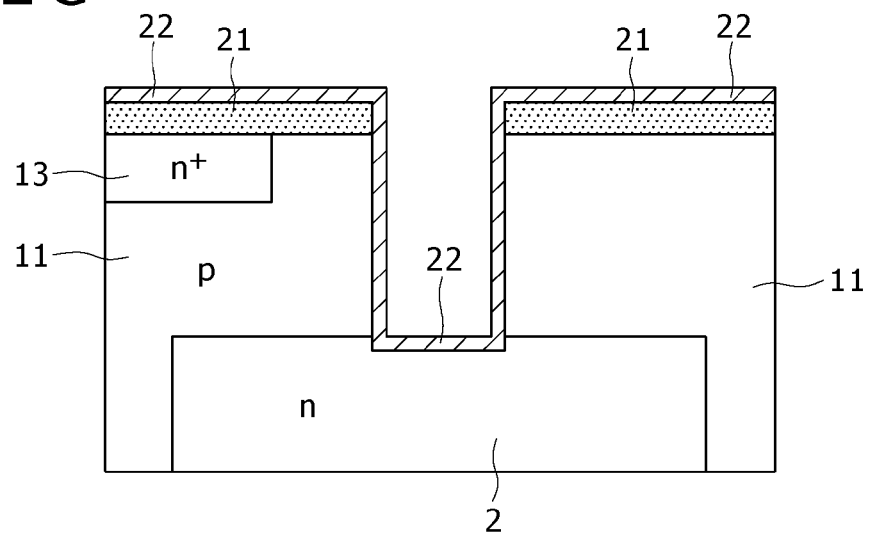

SEMICONDUCTOR DEVICE, METHOD FOR MANUFACTURING SAME, AND SOLID-STATE IMAGE SENSING DEVICE

CROSS-REFERENCES TO RELATED APPLICATIONS

This application contains subject matter related to and claims the benefit of priority from the prior Japanese Patent Application JP 2009-140530, filed in the Japanese Patent Office on 11 Jun. 2009, the disclosure of which is incorporated herein by reference in its entirety to the extent permitted by law.

BACKGROUND OF THE INVENTION

1. Field of the Invention

This invention relates to a semiconductor device having a vertical transistor wherein a gate electrode and a gate insulating film are buried in a semiconductor substrate and a method for manufacturing same. The invention also relates to a solid-state image sensing device having a vertical transistor at a pixel portion.

2. Description of the Related Art

In solid-state image sensing devices, high degrees of integration of circuits have been sought for improving sensitivity and there have been proposed a variety of techniques of keeping the area of a photodiode.

For instance, there is proposed a structure wherein a trench is formed over a photodiode formed at a back side of a silicon substrate and a transfer gate is provided inside the trench thereby forming a vertical transistor (see, for example, Japanese Patent Laid-Open No. 2005-223084, hereinafter referred to as Patent Document 1).

The vertical transistor formed inside the trench includes an electrode material for gate electrode, which is buried in the trench covered with the gate insulating film. The side wall portion and bottom portion of the trench serve as a channel portion.

This structure is able to increase an area of a photodiode when compared with a structure wherein a photodiode and a transfer gate are individually formed at the surface side of a substrate, thereby leading to an improvement in sensitivity.

By the way, because the vertical transistor includes a shape at which an electric field concentration begins, such as a corner portion of a vertical hole, structural reliability is poor.

For the formation of a gate insulating film made of a silicon oxide film, usual practice is to oxidize the surface of a silicon layer by a thermal oxidation (dry oxidation) process using $O_2$ gas and HCl gas or a thermal oxidation (wet oxidation) process using $O_2$ gas, HCl gas and $H_2$ gas.

In the thermal oxidation process, typical of which are these dry and wet oxidation processes, an oxidizing agent such as oxygen ($O_2$), OH or the like is diffused into the oxide film by the thermal energy and reacts with silicon atoms at the interface with the silicon, thereby causing the oxidation process to be advanced.

The reaction between the oxygen being diffused and the silicon at the interface depends on the thermal energy and the Si density at the interface. At the (110) face that is higher in silicon density than the (100) face, the oxidation proceeds more rapidly. Hence, the thickness of the oxide film has a strong silicon face orientation dependence.

SUMMARY OF THE INVENTION

In a silicon substrate, the oxide film thickness ratio of the (110) face having an atomic plane density of $9.6 \times 10^{14}$ atoms/cm$^2$ to the (100) face having an atomic plane density of $6.8 \times 10^{14}$ atoms/cm$^2$ is about 1.5:1 for the dry thermal oxidation and at about 2:1 for the wet thermal oxidation.

Therefore, stresses concentrate, due to the difference in oxidation rate at the respective faces, at the corner portion and side wall portion of the vertical hole where face orientation changes, and the oxidation rate at the corner apex lowers.

Additionally, the corner portion of the vertical hole suffers a great change in shape of the silicon layer due to the thermal oxidation and is turned into a sharply-angled shape.

In this way, the corner portion of the vertical hole becomes an initiation point of electric field concentration, so that the withstand voltage of the gate insulating film of a vertical transistor lowers and reliability degrades.

It is desirable to provide a semiconductor device which overcomes the above-stated existing problems and wherein an electric field concentration can be prevented at a corner portion of a vertical hole of a vertical transistor thereby ensuring high reliability and also to a method for manufacturing such a transistor device.

It is also desirable to provide a solid-state image sensing device using the above-mentioned transistor.

According to one embodiment of the invention, there is provided a semiconductor device including: a semiconductor substrate; a gate insulating film formed on surfaces of the semiconductor substrate including an internal surface of a hole formed in the semiconductor substrate and formed by radical oxidation or plasma oxidation; and a gate electrode formed as buried in the hole. The gate insulating film and the gate electrode form a vertical MOS.

According to another embodiment of the invention, there is provided a method for manufacturing a semiconductor device having a vertical MOS transistor wherein a gate electrode is formed as embedded in a semiconductor substrate. The method includes the steps of forming a hole in the semiconductor substrate, forming a gate insulating film on surfaces of the semiconductor substrate including an internal surface of the hole by radical oxidation or plasma oxidation, and forming an electrode layer of a gate electrode entirely of the semiconductor substrate while filling the hole.

According to a further embodiment of the invention, there is provided a solid-state image sensing device including: a semiconductor substrate; a photodiode formed in the semiconductor substrate on a pixel-by-pixel basis; a gate insulating film formed, by radial oxidation or plasma oxidation, on surfaces of the semiconductor substrate including an internal surface of a hole formed in the semiconductor substrate; and a gate electrode buried in the hole. The gate insulating film and the gate electrode form a vertical MOS serving as a transfer gate over the photodiode.

The semiconductor device of the invention is so configured that the gate insulating film, which is formed on surfaces of the semiconductor substrate including at least the internal surface of the hole buried with the gate electrode of the vertical MOS transistor is formed by radical oxidation or plasma oxidation.

This enables the gate insulating film to be formed in a uniform thickness irrespective of the face orientation of and the impurity concentration in the semiconductor substrate. The gate insulating film formed by radical or plasma oxidation permits roughness at the side wall portion of the hole to be reduced and also the corner portion of the hole to be rounded. The rounding of the corner portion enables an electric field concentration at the corner portion of the hole to be prevented.

According to the method for manufacturing the semiconductor device, the gate insulating film is formed, by radical or plasma oxidation, on surfaces of the semiconductor substrate including at least an internal surface of the hole.

By this, the gate insulating film can be formed in a uniform thickness irrespective of the face orientation of and the impurity concentration in the semiconductor substrate. The formation of the gate insulating film by radical or plasma oxidation permits roughness at the side wall portion of the hole to be reduced and also the corner portion of the hole to be rounded. The rounding of the corner portion enables an electric field concentration at the corner portion of the hole to be prevented.

According to the solid-state image sensing device so configured as set out above, the gate insulating film, which is formed on surfaces of the semiconductor substrate including at least an internal surface of the hole filled with the gate electrode of the vertical MOS transistor, is formed by radical or plasma oxidation.

This allows the gate insulating film to be formed in a uniform thickness irrespective of the face orientation of and the impurity concentration in the semiconductor substrate. The formation of the gate insulating film by radical or plasma oxidation permits roughness at the side wall portion of the hole to be reduced and also the corner portion of the hole to be rounded. The rounding of the corner portion enables an electric field concentration at the corner portion of the hole to be prevented.

According to the invention, an electric field concentration at the corner portion of the hole can be prevented by the formation of the gate insulating film of the vertical MOS transistor by radical or plasma oxidation.

In this way, the withstand voltage of the gate insulating film of the vertical transistor can be satisfactorily guaranteed. Thus, the invention can provide a semiconductor device and a solid-state image sensing device of high reliability.

BRIEF DESCRIPTION OF THE DRAWINGS

FIGS. 2A to 2C are, respectively, a schematic view showing a fabrication step of the semiconductor device of FIG. 1;

DETAILED DESCRIPTION OF THE PREFERRED EMBODIMENTS

Embodiments of the invention are now described including a first embodiment and a modification thereof.
<First Embodiment>

Figure 1:
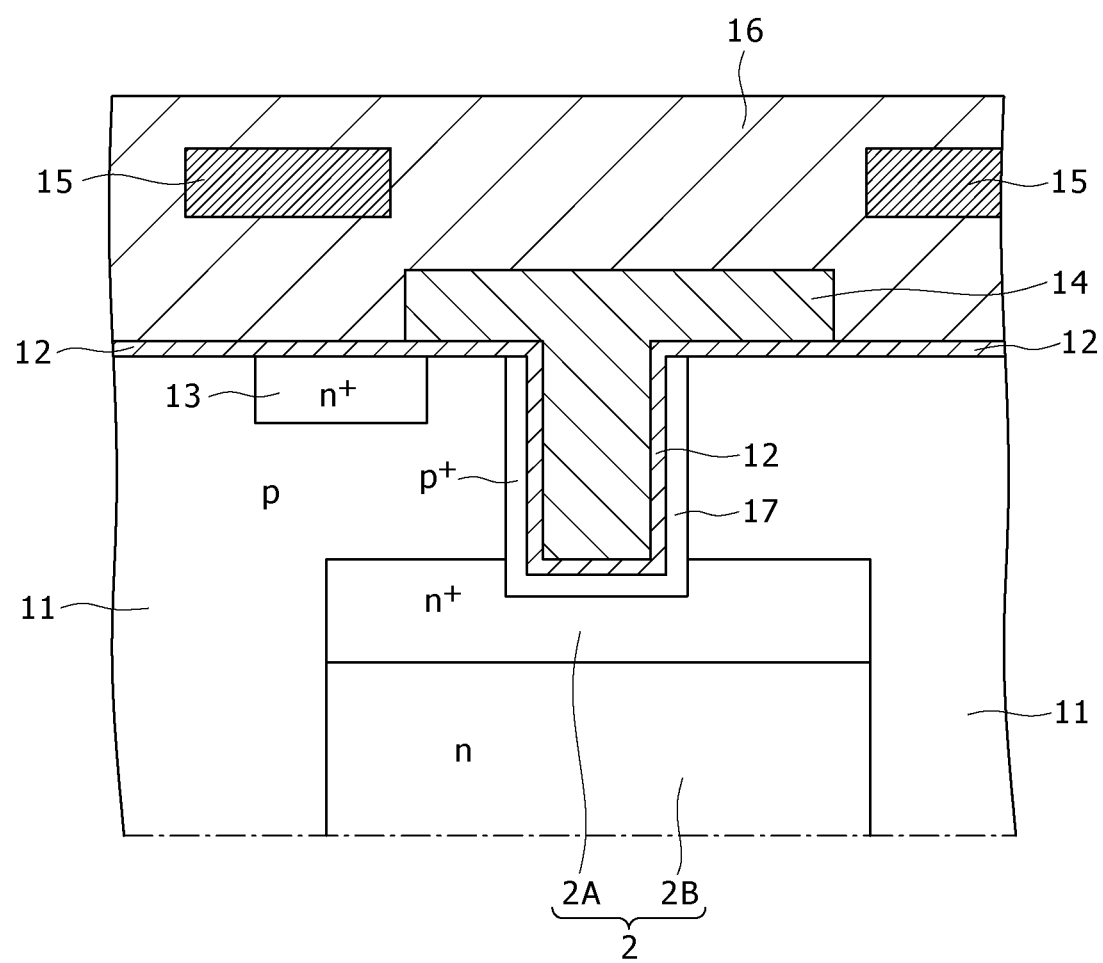
FIG. 1 is a schematic sectional view showing a pixel portion of a semiconductor device (i.e. a solid-state image sensing device) according to a first embodiment of the invention.

FIG. 1 is a schematic sectional view showing a pixel portion of a solid-state image sensing device illustrated as a semiconductor device according to a first embodiment of the invention. This embodiment is the case wherein the invention is applied to a CMOS solid-state image sensing device (CMOS image sensor).

As shown in FIG. 1, a solid-state image sensing device 1 is formed with a transfer transistor made of a vertical NMOS transistor.

It will be noted that at a section not shown, there are formed transistors (for reset, amplification, selection and the like) each made of a planar NMOS transistor and constituting a pixel.

At a logic portion, there are formed a planar NMOS transistor and a planar PMOS transistor.

An n-type impurity region 2 serving as a photodiode of a light-receiving unit is formed at a lower side (back side) of a semiconductor substrate 11 made, for example, of silicon below the vertical NMOS transistor. This n-type impurity region 2 is constituted of a low-concentration n-type impurity region 2B at a lower side and a high-concentration n-type impurity region (n$^+$) 2A at an upper side.

In the vicinity of the surface of the semiconductor substrate 11 above the n-type impurity region 2, an n-type high-concentration (n$^+$) impurity region 13 is formed.

In respect of the transfer transistor made of the vertical NMOS transistor, a gate insulating film 12 is formed along a hole formed in the semiconductor substrate 11, and a gate electrode 14 is filled in the hole of the semiconductor substrate 11 via the gate insulating film 12.

The n-type impurity region 2 of the photodiode and an n-type high-concentration impurity region 13 formed in the vicinity of the surface of the semiconductor substrate 11, respectively, act as source and drain regions. A p-type high-concentration (p$^+$) impurity region 17 is formed at a side wall portion and a bottom portion of the hole of the semiconductor substrate 11, thereby forming a buried channel in association with this impurity region 17.

The n-type high-concentration impurity region 13 in the vicinity of the surface of the semiconductor substrate 11 is used as a so-called floating diffusion (FD) wherein signal charges are read out from the photodiode by operation of a transfer gate.

The semiconductor substrate 11 is formed thereon with an insulating layer 16 covering the gate insulating film 12 and the gate electrode 14. Wiring layers 15 are formed inside the insulating layer 16. It will be noted that although not shown, these wiring layers 15 and insulating layer 16 are formed over other type of transistor of a pixel and a transistor of the logic portion.

Although not particularly shown, the semiconductor substrate 11 is provided at the back side thereof with a color filter and an on-chip lens on a pixel-by-pixel basis, if necessary.

In the solid-state image sensing device 1 of this embodiment, the gate insulating film 12 of the vertical transistor is so configured as to be formed by radical or plasma oxidation.

This permits the hole of the vertical transistor, into which the gate electrode 14 is to be buried, to be rounded at the corner portions thereof, thereby preventing an electric field concentration thereat. Additionally, in the p-type high concentration (p$^+$) impurity region 17 constituting the buried channel, the variation in profile of the p-type impurity (such as boron or the like) can be suppressed.

This is now described in more detail.

With a vertical transistor, a channel is formed around a hole formed in a semiconductor substrate by dry etching, so that interface states become generated in great number through etching damage. Because of the interface states generated in great number, the transfer characteristics degrade in respect of solid-state image sensing devices.

To avoid this, with the configuration set out in the aforementioned Patent Document 1, there is adopted a buried channel structure for a transfer gate of an NMOS vertical transistor so as to cope with the characteristic degradation, such as a white spot, ascribed to the interface states. More particularly, a p-type impurity such as boron (B) or the like is introduced at the side wall portion and bottom portion of the hole of the vertical transistor, thereby providing a structure wherein the hole is covered with the p-type impurity region.

In order to form such a structure, after the introduction of a p-type impurity such as boron or the like by ion implantation into the side wall portion and bottom portion of the hole formed in the semiconductor substrate, a gate insulating film is formed along the hole, followed by burying the hole with a gate electrode.

However, the vertical transistor is a three-dimensional conformation, under which when the gate insulating film is formed by oxidation, the profile of the p-type impurity in the buried channel may vary, or the shape of the hole at the corner portion thereof may be changed.

Especially, when using an existing thermal oxidation process of forming a gate insulating film, the characteristic variation and reliability of the vertical transistor lower.

The profile of a p-type impurity in the buried channel is in direct relation with pixel characteristics such as a white spot or the like. Thus, when compared with the buried channel of a MOS transistor of the logic portion, the MOS transistor of the pixel portion suffers a greater influence on transistor characteristics in dependence on the variation of the profile.

Upon oxidation, a p-type impurity such as boron or the like in the silicon gradually diffuses toward the surface side of the oxide film and released into the air. In this connection, the p-type impurity such as boron or the like differs in diffusion rate depending on the face orientation of silicon. In a thermal oxidation process wherein the oxidation time is long, the profile of the p-type impurity at the buried channel portion greatly changes, thereby causing a characteristic variation of transistor.

To cope with this, it may occur to one that in order to appropriately form a given concentration distribution of a p-type impurity around the hole while taking into account the variation in profile of the p-type impurity in the course of oxidation, ion implantation conditions are controlled to change correspondingly to the face orientation of silicon. However, existing manufacturing techniques have never been able to control the ion implantation conditions as such.

On the other hand, in the radical or plasma oxidation, there are used O radicals or OH radicals formed by thermal reaction of $H_2$ gas or $O_2$ gas, or O radicals generated by plasma excitation, so that the oxidizing agent per se has an energy. Therefore, the progress of the oxidation process is rate-controlled by the diffusion in the oxide film rather than by the reaction at the silicon interface. In the course of the reaction at the silicon interface, oxidation proceeds irrespective of the silicon density.

More particularly, with the radical or plasma oxidation, oxidation proceeds uniformly despite the face orientation of silicon, so that the corner portion of the hole can be shaped as having a great radius of curvature.

In this way, shape angling, which is caused by stress concentration ascribed to the difference in oxide film thickness at the corner portion of the hole, can be suppressed.

Furthermore, in the radical oxidation process, the film forming rate is not dependent on the impurity concentration in silicon of the underlying semiconductor substrate 11.

It will be noted that with the thermal oxidation process, the film forming rate depends on the impurity concentration of an underlying silicon layer and that growth and diffusion occur in a high concentration region thereby forming a thicker oxide film than in a low concentration region.

Figure 5A:
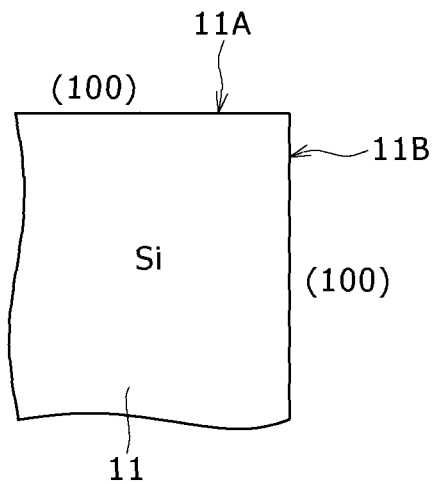
FIGS. 5A to 5C are, respectively, schematic views illustrating, for comparison, the states of oxide films obtained by different oxidation processes.

Corner changes are compared with each other in case where the silicon substrate 11, as shown in FIG. 5A, which has a (100) face at an upper surface 11A and a (110) face at the side surface 11B and is shaped consciously of the corner portion of the hole, is subjected to oxidation according to the respective oxidation processes.

Figure 5B:
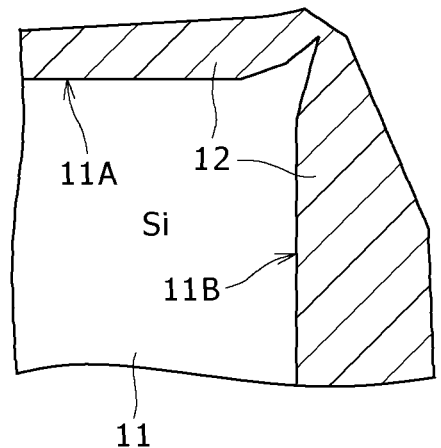

Initially, where a gate insulating film 12 is formed by an existing thermal oxidation process, the oxide film of the gate insulating film 12 is formed as being thicker at the side surface 11B than at the upper surface 11A of the silicon substrate 11 as is particularly shown in FIG. 5B. At the corner portion of the hole, the silicon substrate 11 is unlikely to be oxidized by the action of stress concentration and is apt to remain, thereby providing an angled shape. Thus, an electric field concentration becomes liable to occur.

Figure 5C:
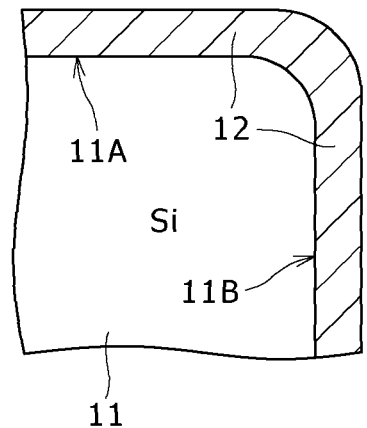

In contrast, where the gate insulating film 12 is formed by radical or plasma oxidation, the gate insulating film 12 is formed as being substantially uniform in thickness and is rounded at the corner portion of the hole as shown in FIG. 5C. In this way, the electric field concentration can be suppressed from occurring.

When using the radical or plasma oxidation, oxidation can be made within a relatively short time and the progress of oxidation is uniform irrespective of face orientation. Thus, the variation in profile of a p-type impurity in the buried channel is lessened, thus enabling the profile of the p-type impurity inside the hole can be uniformly controlled.

Further, since the progress of oxidation is uniform irrespective of face orientation, the gate insulating film 12 can be formed substantially in the same thickness over regions of the semiconductor substrate 11 where impurity concentrations differ. For instance, if the impurity concentrations in the semiconductor substrate differ by not less than an order of magnitude, it is possible to make a difference in thickness of the gate insulating film 12 within 2%.

Next, a method for manufacturing the solid-state image sensing device of this embodiment is described with reference to FIG. 2A to FIG. 4G. It will be noted that in these figures, portions or parts may be shown as simplified, e.g. the $n^+$ region 2A and the n region 2B of FIG. 1 are collectively depicted as an n-type impurity region 2.

As shown in FIG. 2A, a semiconductor substrate 11, in which an n-type impurity region 2 serving as a photodiode and an n-type high concentration impurity region 13 serving as a floating diffusion have been formed, is formed thereon with a silicon-based insulating film 21, for example, by a CVD method. This silicon-based insulating film is formed, by photolithography, into a pattern having an opening corresponding to a hole for vertical transistor. The silicon-based insulating film 21 includes a silicon nitride film, a silicon oxide film, or a silicon oxynitride film.

Next, as shown in FIG. 2B, the semiconductor substrate 11 is processed by dry etching through a mask of the silicon insulating film 21 to form a trench in the semiconductor substrate 11. The depth of the trench is such that the bottom of the trench is in contact with the impurity region 2 of the photodiode PD. For instance, the depth is at about 1.0 μm.

As shown in FIG. 2C, a sacrificial oxide film 22 is formed over the surface of the semiconductor substrate 11 including those of the trench. The sacrificial oxide film 22 is formed according to a radical oxidation process using $H_2$ gas and $O_2$ gas as starting gases, which process is free of face orientation dependence and is effective for shape-rounding the trench corner.

Figure 3D:
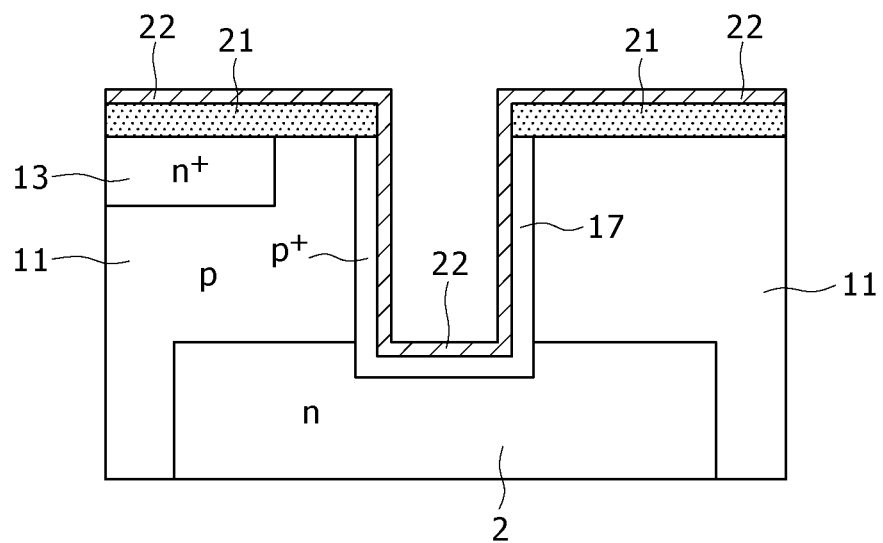
FIGS. 3D and 3E are, respectively, a schematic view showing a fabrication step subsequent to the steps of FIGS. 2A to 2C.

Next, as shown in FIG. 3D, a p-type impurity such as boron (B) or the like is implanted into the side wall and bottom portions of the trench through a mask of the silicon insulating film 21 by an ion implantation method to form a p-type high concentration ($p^+$) impurity region 17 serving as a buried channel of a transfer gate.

Preferably, the ion implantation concentration is so set that the concentration of the p-type impurity in the semiconductor substrate 11 after formation of a gate insulating film 12 is made at not less than $1\times10^{13}$ atoms/cm$^2$.

Figure 3E:
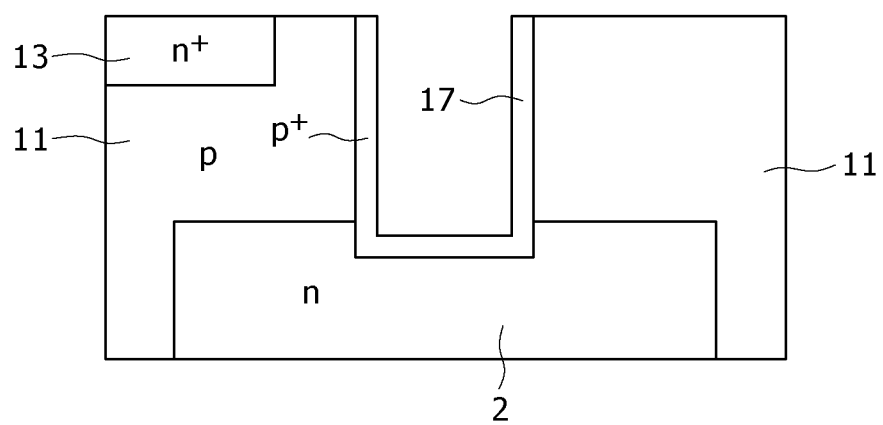

As shown in FIG. 3E, the sacrificial oxide film 22 and the silicon-based insulating film 21 are, respectively, removed with a chemical solution containing HF or $H_3PO_4$.

Figure 4F:
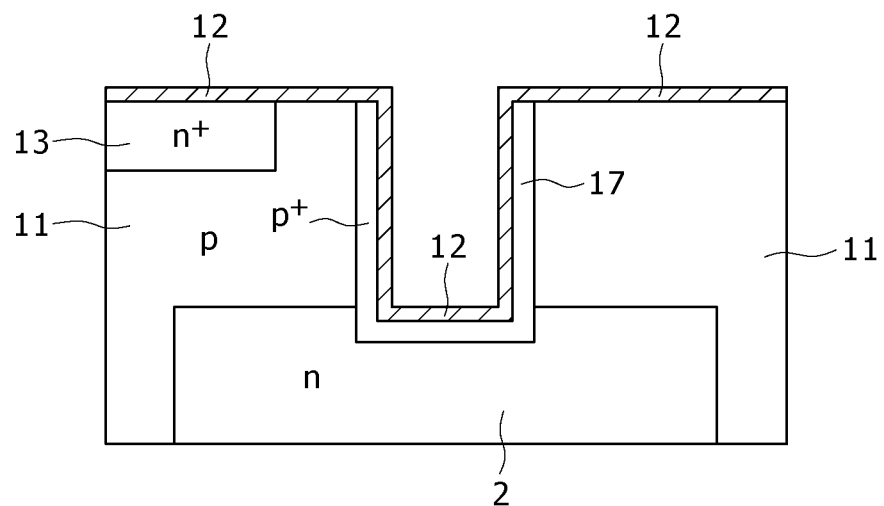
FIGS. 4F and 4G are, respectively, a schematic view showing a fabrication step subsequent to the steps of FIGS. 3D and 3E.

Subsequently, as shown in FIG. 4F, a gate insulating film 12 is formed on the surfaces of the semiconductor substrate 11 including those of the trench according to a radical oxidation process which is low in face orientation dependence of the substrate and is effective for shape-rounding the silicon corner portion and for reduction of roughness. The thickness of the gate insulating film 12 is set, for example, at 5 to 10 nm. The radical oxidation at this stage is carried out, for example, using starting $H_2$ gas and $P_2$ gas at a temperature of 800 to 1,100° C.

The variation in thickness, within the vertical transistor, of the gate insulating film 12 formed by the radical oxidation is such that maximum value/minimum value≤1.3 (1.2 to 1.4).

The gate insulating film 12 formed by the radical oxidation is formed at least at a portion of the vertical transistor. Preferably, the gate insulating film is formed not only over the vertical transistor, but also over the entire circuits of the pixel portion. In addition, the gate insulating film 12 may be formed by the radical oxidation simultaneously over the circuits of a logic portion.

With the radical oxidation, there is no variation of a film forming rate ascribed to the impurity, so that the gate insulating film 12 is formed in the same thickness over portions of the semiconductor substrate 11 which have different impurity concentrations.

It will be noted that the gate insulating film 12 may be formed by plasma oxidation, which is carried out at room temperature to 400° C. and makes use of starting $H_2$ gas and $O_2$ gas, in place of the above-stated radical oxidation.

Figure 4G:
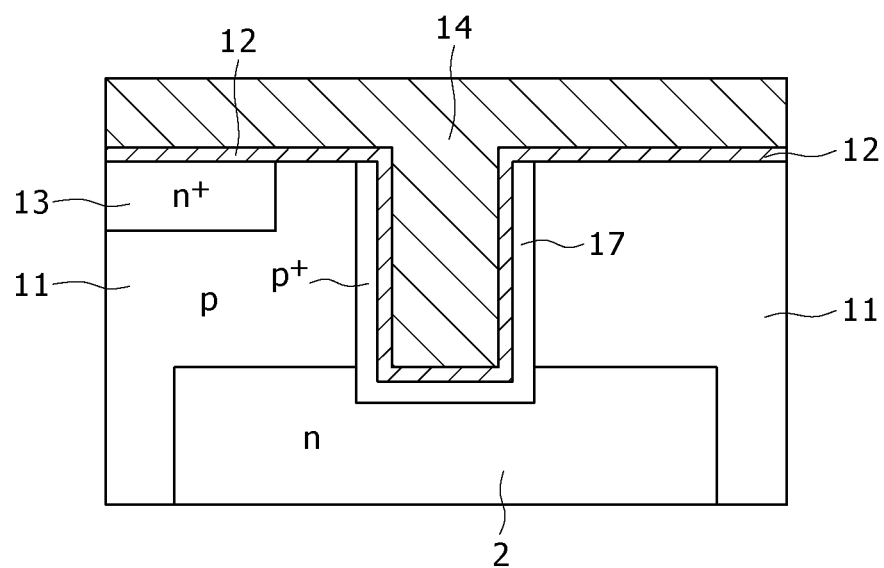

Next, as shown in FIG. 4G, an electrode layer of a gate electrode 14 is formed on the gate insulating film 12 inside the trench to fill the trench.

A material for the electrode layer of the gate electrode 14 includes polycrystalline silicon or amorphous silicon, which is formed by a CVD method using, as a material for the electrode layer, a starting gas including, for example, $SiH_4$, $PH_3$ and $H_2$ and into which a phosphorus (P) is introduced as an n-type impurity.

Additionally, the electrode layer is subjected to patterning to form the gate electrode 14.

Thereafter, an insulating layer 16 is formed to cover the gate electrode 14 therewith, and a wiring layer 15 and an insulating layer 16 are repeatedly formed.

In this way, the solid-state image sensing device 1 of this embodiment can be fabricated.

In the vertical transistor formed by the above-stated method, the difference in thickness of the gate insulating films 12 at the bottom portion, upper portion and side wall portion of the trench is within a variation range as small as 20 to 30%.

In contrast, where the gate insulating film 12 is formed by thermal oxidation, the difference in thickness of the gate insulating film 12 is as great as 50 to 100%.

According to the configuration of the solid-state image sensing device 1 of the embodiment and the above-stated method, the gate insulating film 12 is formed by radical or plasma oxidation, so that the gate insulating film 12 is formed in a uniform thickness irrespective of the face orientation of the semiconductor substrate 11. With the gate insulating film 12 formed by the radical or plasma oxidation, roughness at the side wall portion of the hole is reduced and the corner portion of the hole is rounded. The rounding of the corner portion of the hole permits an electric filed concentration at the corner portion to be prevented.

In this manner, the withstand voltage of the gate insulating film of the vertical transistor can be satisfactorily guaranteed.

Thus, according to the invention, there can be realized a semiconductor device or solid-state image sensing device of high reliability.

Since the oxidation rate is not dependent on the face orientation of the semiconductor substrate 11, the diffusion rate of the impurity in the p-type high concentration impurity region 17 is also not dependent on the face orientation and thus the profile of the p-type impurity in the hole can be uniformly controlled. This enables a variation of carries transferred via the vertical transistor to be stabilized and the degradation of the transfer characteristics can be prevented.

Further, this enables the gate insulating film to be formed in a substantially uniform thickness irrespective of the impurity concentration in the semiconductor substrate 11.

Accordingly, according to the embodiment, good pixel characteristics and high reliability can be balanced in the solid-state image sensing device.

<Modifications>

In the above embodiment, the p-type high concentration impurity region 17 has been provided at the side wall portion and bottom portion of the trench thereby forming the buried channel.

The invention is applicable to a vertical transistor wherein no buried channel is formed.

In the foregoing embodiment, phosphorus (P) and boron (B) are, respectively, introduced as an n-type impurity and a p-type impurity. In the practice of the invention, no limitation is placed on these impurity elements and elements other than those mentioned above may be used as the n-type or p-type impurity.

In the above embodiment, illustration has been made using a silicon substrate as the semiconductor substrate 11. In the practice of the invention, other type of silicon layer such as a silicon epitaxial layer on a silicon substrate or a silicon layer formed on other type of substrate may be used as the semiconductor substrate 11.

Alternatively, a semiconductor other than silicon may be used as the semiconductor substrate 11.

In the above embodiment, the invention has been applied to a solid state image sensing device. The invention is also applicable to semiconductor devices of the type which has a transistor and other types of circuit devices.

Other types of devices include a resistor, a capacitor, a memory element, a photodiode and the like. Examples of a semiconductor device having a photodiode include a semiconductor device having a light-receiving element made of a single photodiode unlike solid-state image sensing devices having a photodiode on a pixel-by-pixel basis, e.g. an infrared sensor, a device of receiving and detecting a laser beam, and the like.

Other types of circuit elements may be formed not only below a vertical transistor, but also over a gate electrode of a vertical transistor.

Further, in the above embodiment, the vertical transistor is directed to an NMOS transistor. The invention is also applicable to a solid-state image sensing device or semiconductor device of the type wherein if the vertical transistor is made of a PMOS transistor, the respective layers are made as having conduction types opposite to those in the above embodiment.

More particularly, where the vertical transistor is made of a MOS transistor having a first conduction type channel, a buried channel is formed by ion implanting an impurity of a second conduction type into a semiconductor substrate around a hole in which a gate electrode is buried.

The invention should not be construed as limited to those embodiments set forth above and may include many variations without departing from the spirit of the invention.

The present application contains subject matter related to that disclosed in Japanese Priority Patent Application JP 2009-140530 filed in the Japan Patent Office on Jun. 11, 2009, the entire content of which is hereby incorporated by reference.

What is claimed is:

1. A semiconductor device comprising: a semiconductor substrate having a trench, wherein the trench has a sidewall portion and a bottom portion; an impurity region formed at the sidewall portion and the bottom portion of the trench of the semiconductor substrate, thereby forming a buried channel in association with the impurity region wherein the impurity region is in contact with a photodiode impurity region having a high concentration region and a low concentration region, wherein the high concentration region is in direct contact with the impurity region and the high concentration region is above the low concentration region;
a gate insulating film formed, by one of a radical oxidation process and a plasma oxidation process, on an internal surface of the sidewall and the bottom portion of the trench and on surfaces of the semiconductor substrate; and
a gate electrode formed as buried in the trench, wherein, the gate insulating film and the gate electrode form a vertical metal oxide semiconductor transistor, the gate insulating film is formed in a uniform thickness irrespective of a face orientation of and an impurity concentration in the semiconductor substrate, and the gate insulating film is in contact with the impurity region and the impurity region is in contact with the photodiode impurity region.

2. The semiconductor device of claim 1, wherein the vertical metal oxide semiconductor transistor is made of a metal oxide semiconductor transistor of a first conduction type and further comprises the impurity region of a second conduction type formed at a-the side wall portion and the bottom portion of the trench in the semiconductor substrate.

3. The semiconductor device of claim 2, wherein a profile of the impurity of the second conduction type inside the hele-trench is substantially constant.

4. The semiconductor device of claim 3, wherein the impurity region has a concentration of not less than $1 \times 10^{13}$ atoms/$cm^3$ after the gate insulating film is formed.

5. The semiconductor device of claim 1, wherein the gate insulating film inside the hole has a thickness ratio expressed as:
maximum value/minimum value≤1.3.

6. The semiconductor device of claim 1, wherein the corner portion of the trench is curvedly rounded.

7. A method for manufacturing a semiconductor device having a vertical metal oxide semiconductor transistor wherein a gate electrode is buried in a semiconductor substrate, the method comprising:
forming a trench a trench in the semiconductor substrate, wherein the trench has a sidewall portion and a bottom portion; an impurity region formed at the sidewall portion and the bottom portion of the trench of the semiconductor substrate, thereby forming a buried channel in association with the impurity region, wherein the impurity region is in contact with a photodiode impurity region having a high concentration region and a low concentration region, wherein the high concentration region is in direct contact with the impurity region and the high concentration region is above the low concentration region;
wherein, the gate insulating film is formed in a uniform thickness irrespective of a face orientation of and an impurity concentration in the semiconductor substrate, and the gate insulating film is in contact with the impurity region and the impurity region is in contact with the photodiode impurity region.

8. The semiconductor device of claim 1, wherein the impurity region has a concentration of not less than $1 \times 10^{13}$ atoms/$cm^3$ after the gate insulating film is formed.

9. The semiconductor device of claim 1, wherein the gate electrode is formed over the gate insulating film over the surfaces of the semiconductor substrate and wherein the gate electrode is above at least a portion of a drain region.

10. A solid-state image sensing device comprising:
a semiconductor substrate having a trench, wherein the trench has a sidewall portion and a bottom portion, an impurity region formed at the sidewall portion and the bottom portion of the trench of the semiconductor substrate, thereby forming a buried channel in association with the impurity region;
a photodiode impurity region having a high concentration region and a low concentration region, wherein the high concentration region is in direct contact with the impurity region and the high concentration region is above the low concentration region; a photodiode formed in the semiconductor substrate on a pixel-by-pixel basis; an impurity region formed at the sidewall portion and the bottom portion of the trench of the semiconductor substrate, thereby forming a buried channel in
association with the impurity region; a gate insulating film formed, by radial oxidation or plasma oxidation, on an internal surface of the sidewall and the bottom portion of the trench and on surfaces of the semiconductor substrate; and a gate electrode buried in the hole, wherein, the gate insulating film and the gate electrode form a vertical metal oxide semiconductor transistor serving as a transfer gate over the photodiode, the gate insulating film is formed in a uniform thickness irrespective of a face orientation of and an impurity concentration in the semiconductor substrate, and the gate insulating film is in contact with the impurity region and the impurity region is in contact with the photodiode impurity region.

11. The solid-state image sensing device of claim 10, wherein the vertical metal oxide semiconductor transistor includes a metal oxide semiconductor transistor of a first conduction type and further comprises the impurity region of a second conduction type formed at the side wall portion and the bottom portion of the trench in the semiconductor substrate.

12. A method for manufacturing a semiconductor device, comprising: forming a trench in the semiconductor substrate, wherein the trench has a sidewall portion and a bottom portion forming an impurity region at the sidewall portion and the bottom portion of the trench of the semiconductor substrate, thereby forming a buried channel in association with the impurity region; wherein the impurity region is in direct contact with a photodiode impurity region having a high concentration region and a low concentration region, wherein the high concentration region is in contact with the bottom portion of the trench and the high concentration region is above the low concentration region;
forming, by one of a radical oxidation process and a plasma oxidation process, a gate insulating film on an internal surface of the sidewall and the bottom portion of the trench in the impurity region and on surfaces of the semiconductor substrate; and forming an electrode layer of the gate electrode inside the trench so as to fill the trench, wherein, the gate insulating film is formed in a uniform thickness irrespective of a face orientation of and an impurity concentration in the semiconductor substrate, and the gate insulating film is in contact with the impurity region and the impurity region is in contact with the photodiode impurity region.

13. The method of claim 12, wherein the impurity region comprises a p-type high-concentration impurity region.

* * * * *